United States Patent
Ye et al.

(10) Patent No.: US 8,680,944 B2
(45) Date of Patent: Mar. 25, 2014

(54) SINGLE-CHIP DUPLEXER WITH ISOLATION SHIELD BETWEEN TRANSMIT AND RECEIVE FILTERS

(75) Inventors: Shen Ye, Cupertino, CA (US); Herbert L. Ko, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 372 days.

(21) Appl. No.: 13/005,807

(22) Filed: Jan. 13, 2011

(65) Prior Publication Data

US 2012/0182087 A1    Jul. 19, 2012

(51) Int. Cl.
*H03H 9/10*        (2006.01)
*H03H 9/00*        (2006.01)

(52) U.S. Cl.
USPC ............................................ 333/133; 333/187

(58) Field of Classification Search
USPC .................................. 333/133, 187, 189, 193
See application file for complete search history.

(56) References Cited

U.S. PATENT DOCUMENTS

| | | | |
|---|---|---|---|
| 6,262,637 B1 | 7/2001 | Bradley et al. | |
| 6,369,672 B1 | 4/2002 | Ikada | |
| 6,903,631 B2 | 6/2005 | Kushitani et al. | |
| 6,927,649 B2 | 8/2005 | Metzger et al. | |
| 7,116,187 B2 | 10/2006 | Inoue | |
| 7,180,467 B2 | 2/2007 | Fabrega-Sanchez et al. | |
| 7,289,008 B2 | 10/2007 | Kuroki et al. | |
| 7,298,231 B2 * | 11/2007 | Ikuta et al. | 333/133 |
| 7,301,420 B2 | 11/2007 | Yamaguchi et al. | |
| 7,339,445 B2 | 3/2008 | Aigner et al. | |
| 7,385,463 B2 * | 6/2008 | Koga et al. | 333/133 |
| 7,403,082 B2 | 7/2008 | Kearns | |
| 7,498,899 B2 | 3/2009 | Iwaki et al. | |
| 7,501,912 B2 | 3/2009 | Jamneala | |
| 7,602,264 B2 * | 10/2009 | Itou et al. | 333/193 |
| 7,800,461 B2 | 9/2010 | Terada | |
| 7,808,935 B2 | 10/2010 | Koga et al. | |
| 7,821,357 B2 | 10/2010 | Heinze et al. | |
| 2005/0073375 A1 | 4/2005 | Sul et al. | |
| 2006/0139121 A1 | 6/2006 | Jhung | |
| 2007/0046395 A1 | 3/2007 | Tsutsumi et al. | |
| 2008/0079648 A1 | 4/2008 | Forstner et al. | |
| 2008/0100397 A1 | 5/2008 | Nam et al. | |
| 2009/0149136 A1 | 6/2009 | Rofougaran | |
| 2010/0150075 A1 | 6/2010 | Inoue et al. | |
| 2010/0194488 A1 | 8/2010 | Yoshimoto | |
| 2010/0244979 A1 | 9/2010 | Matsuda et al. | |
| 2010/0272310 A1 | 10/2010 | Philliber et al. | |
| 2011/0018654 A1 | 1/2011 | Bradley et al. | |

* cited by examiner

*Primary Examiner* — Dean O Takaoka (57) ABSTRACT

A single-chip duplexer, interfacing a receiver and a transmitter with a common antenna, includes transmit and receive filters, an annular sealing ring and a conductive stripe. The transmit filter is connected between the antenna and the transmitter, and has a transmit passband. The receive filter is connected between the antenna and the receiver, and has a receive passband different from the transmit passband. The annular sealing ring is connected between a surface of the chip and a surface of a cap to form a sealed cavity between the chip and the cap. The conductive stripe extends across at least a portion of the surface of the chip between the transmit filter and the receive filter, the conductive stripe being directly connected to the sealing ring and electrically connected to ground. The conductive stripe provides at least one of magnetic shielding and capacitive shielding between the transmit filter and the receive filter.

19 Claims, 9 Drawing Sheets

SINGLE-CHIP DUPLEXER WITH ISOLATION SHIELD BETWEEN TRANSMIT AND RECEIVE FILTERS

BACKGROUND

Portable communication devices, such as cellular telephones, personal digital assistants (PDAs), electronic gaming devices, laptop computers, and the like, are configured to communicate over wireless networks. Accordingly, each such portable communication device includes a transmitter (TX) and a receiver (RX), typically connected to a common antenna, for sending and receiving data and control signals over the wireless network. In order to use the common antenna, a duplexer may be used to electrically connect the common signal path to the output of the transmitter and to the input of the receiver, so that the transmitter is able to send signals on a transmit frequency and the receiver is able to receive signals on a different receive frequency with negligible interference between the transmit and receive signals.

A duplexer provides coupling, while preventing the transmit signal generated by the transmitter from being coupled from the common antenna back to the input of the receiver and overloading the receiver. Generally, the duplexer includes two band-pass filters having different passbands for filtering the transmit and receive signals, respectively, thus preventing or reducing interference between the transmit and receive signals. The filters are connected in parallel at the common antenna, and need to have sufficient rejection for the opposite band.

The duplexer has three ports. The first port is connected to the antenna, the second port is connected to the transmitter and the third port is connected to the receiver. Transmit and receive signals are assigned to different frequency bands, referred to as the transmit (uplink) frequency band and the receive (downlink) frequency band, respectively. However, the transmit and receive signals co-exist at the common antenna, as discussed above. Thus, for the transmission path, the duplexer suppresses all signals outside the transmit frequency band, and for the reception path, the duplexer suppresses all signals outside the receive frequency band. Hence, the duplexer includes two frequency selective radio frequency (RF) filters, one filter for the transmit frequency band and the other filter for receive frequency band. Both filters are electrically connected to the common antenna port. In order to prevent the impedance of one of the filters to degrade the antenna side impedance of the other filter, an additional matching circuit is included.

The transmitters and receivers may be implemented in various types of wireless network, according to different communication standards, such as universal mobile telecommunications system (UMTS), global system for mobile communication (GSM), personal communications services (PCS), digital cellular system (DCS), international mobile telecommunication (IMT), and enhanced data rates for GSM evolution (EDGE). The communication standards identify separate bands for transmitting and receiving signals. For example, UMTS Band 1 (IMT) provides an uplink frequency band of 1920 MHz-1980 MHz and a downlink frequency band of 2110 MHz-2170 MHz; UMTS Band 2 (PCS) provides an uplink frequency band of 1850 MHz-1910 MHz and a downlink frequency band of 1930 MHz-1990 MHz; UMTS Band 3 (DCS) provides an uplink frequency band of 1710 MHz-1785 MHz and a downlink frequency band of 1805 MHz-1880 MHz; UMTS Band 7 (IMT-E) provides an uplink frequency band of 2500 MHz-2570 MHz and a downlink frequency band of 2620 MHz-2690 MHz; and UMTS Band 8 (GMS-900) provides an uplink frequency band of 880 MHz-915 MHz and a downlink frequency band of 925 MHz-960 MHz. Accordingly, a duplexer operating in compliance with a UMTS standard would include a transmit filter having a passband within the corresponding uplink frequency band, and a receive filter having a passband within the corresponding downlink frequency band.

Demand for smaller, less expensive and more efficient portable communication devices is significant. Therefore, reducing size and weight of portable communication devices, as well as reducing fabrication costs and increasing product yield, are priorities. For example, there is demand for the filters of duplexers in portable communication devices to be smaller, to consume less power, to have improved performance characteristics (such as lower insertion loss and higher out-of-band attenuation), and to operate at higher frequencies. Such duplexers may include resonators for filtering the transmit and receive signals, such as a thin film bulk acoustic resonators (FBARs) and/or bulk acoustic wave (BAW) resonators. Further, duplexers have been developed that include the FBAR and/or BAW resonator transmit and receive filters on a single chip, further reducing size and weight. However, interference between the transmit and receive filters further increases due to the single-chip topology, e.g., resulting in undesirable magnetic coupling and capacitive coupling (i.e., parasitic capacitance or electrical induction) between the transmit and receive filters.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

In addition, it is understood that when an element is referred to as "connected" or "coupled" to another element, it can be directly connected or coupled to the other element or intervening elements may be present. Similarly, when an element is referred to as "electrically connected" or "electrically coupled" to another element, or in "electrical contact with" another element, it can be directly connected or coupled to the other element or intervening elements may be present, so long as electrical connection between the elements is made. In contrast, when an element is referred to as being "directly connected" or "directly coupled" to another element, there are no intervening elements present.

Figure 1:
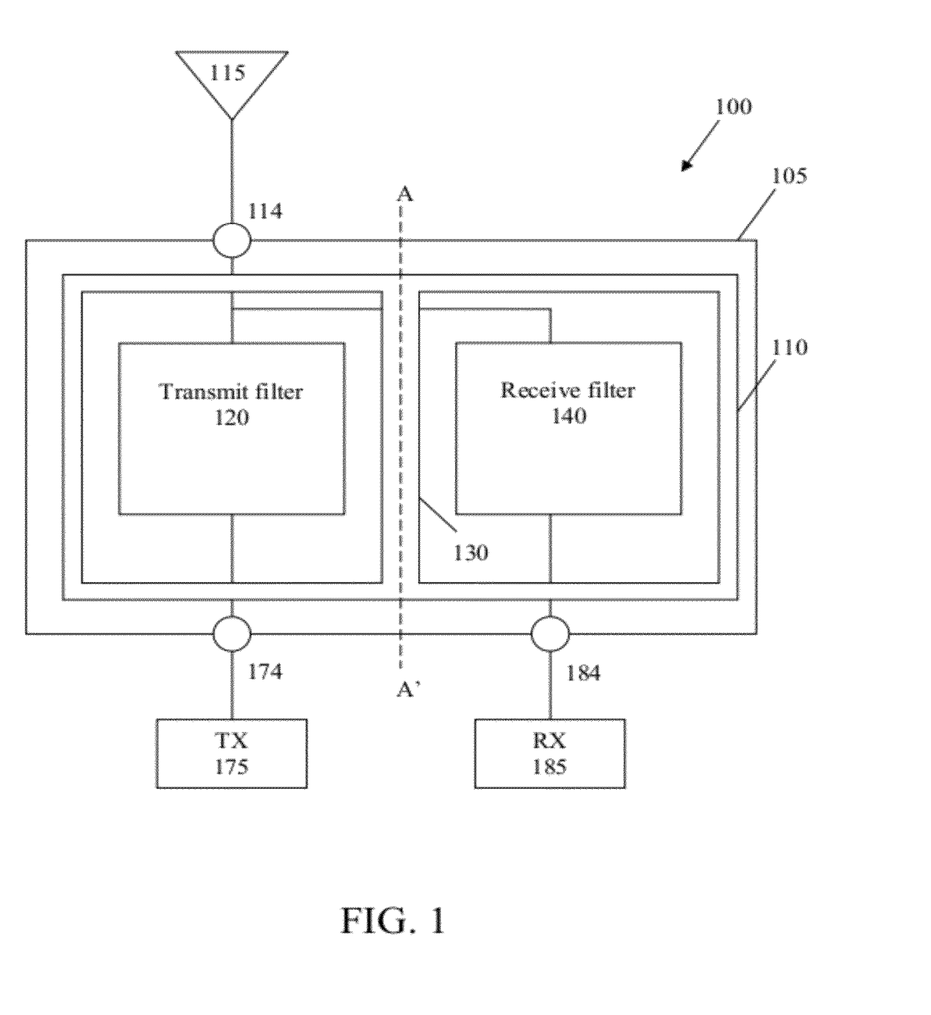
FIG. 1 is a block diagram illustrating a duplexer formed on a single chip, according to a representative embodiment.

FIG. 1 is a block diagram illustrating a duplexer formed on a single chip, according to a representative embodiment.

Referring to FIG. 1, duplexer 100 (referred to herein as "single-chip duplexer 100) is formed on a single chip 105, and interfaces transmitter (TX) 175 and receiver (RX) 185 with a common antenna 115, for sending and receiving wireless communications signals, respectively. The wireless communications signals may be RF signals, for example, complying with various communication standards, examples of which are discussed above.

In the depicted representative embodiment, the single-chip duplexer 100 includes transmit filter 120, connected between the transmitter 175 through transmitter terminal 174 and common antenna 115 through antenna terminal 114, and receive filter 140, connected between the receiver 185 through receiver terminal 184 and the common antenna 115 through the antenna terminal 114. The antenna terminal 114, the transmitter terminal 174 and the receiver terminal 184 may correspond to connecting pads or other terminals on the chip 105, respectively. According to various embodiments, the transmit filter 120 and the receive filter 140 are film bulk acoustic resonator (FBAR) filters or bulk acoustic wave (BAW) resonator filters, which include multiple FBAR or BAW resonators, respectively, examples of which are discussed below with reference to FIG. 8. The transmit filter 120 and the receive filter 140 have corresponding passbands, which differ from one another. It may be assumed for purpose of discussion that the receive filter 140 has a higher passband than the transmit filter 120, although the opposite may be true in alternative implementations.

The chip 105 includes a substrate formed from any material compatible with semiconductor processes, such as silicon (Si), gallium arsenide (GaAs), indium phosphide (InP), or combinations thereof. An annular sealing ring 110 is formed on a first surface of the chip 105. The annular sealing ring 110 surrounds the circuitry of the transmit filter 120 and the receive filter 140, and extends generally around an outer periphery of the chip 105. The annular sealing ring 110 also connects with a first surface of a lid or cap (not shown in FIG. 1) positioned over and facing the first surface of the chip 105, as discussed below with reference to FIGS. 2A-2C, for example. In an embodiment, the annular sealing ring 110 is formed of gold (Au), for example, although other conductive materials may be incorporated without departing form the scope of the present teachings. Also, in an embodiment, the annular sealing ring 110 may only partially surround the circuitry of the transmit filter 120 and the receive filter 140.

A conductive trace or stripe 130 (referred to below as "conductive stripe 130") is also formed on the first surface of the chip 105. The conductive stripe 130 may be formed of any conductive material compatible with semiconductor processors, such as tungsten (W), molybdenum (Mo), aluminum (Al), Au, or combinations thereof. In the depicted embodiment, the conductive stripe 130 is positioned on the chip 105 between the transmit filter 120 and the receive filter 140, and is directly connected at both ends to the annular sealing ring 110. The annular sealing ring 110, and thus the conductive stripe 130, is electrically connected to ground.

Accordingly, the conductive stripe 130 forms a barrier or an isolation shield separating the transmit filter 120 and the receive filter 140, thus improving isolation characteristics of the transmit filter 120 and the receive filter 140. More particularly, in the depicted configuration, the conductive stripe 130 serves as both an electromagnetic shield for reducing magnetic coupling and a capacitive shield for reducing capacitive coupling (i.e., parasitic capacitance or electrical induction) between the transmit filter 120 and the receive filter 140. As a result, the transmit filter 120 has increased antenna-to-receiver port rejection in the transmit passband, and the receive filter 140 has increased antenna-to-transmitter port rejection in the receive passband, for example. An example of improved isolation characteristics is discussed below with reference to FIG. 7.

Figure 2A:
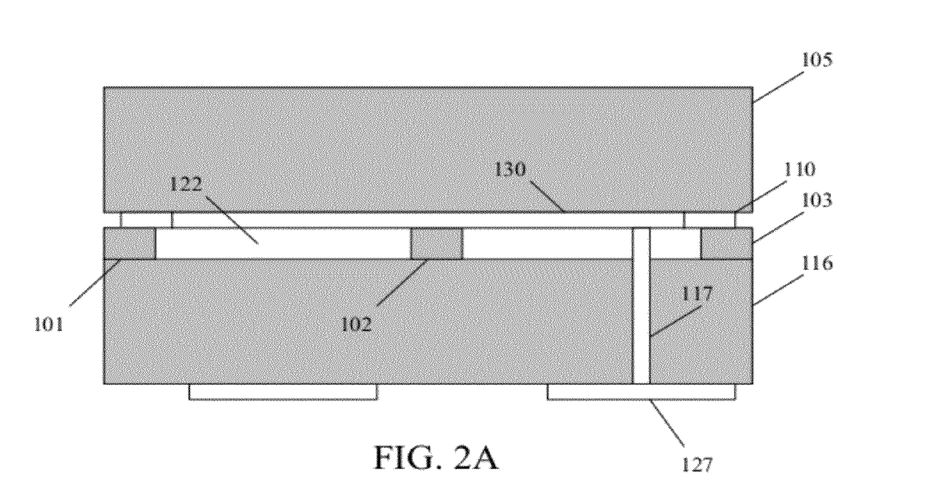
FIGS. 2A-2C are cross-sectional diagrams illustrating duplexers formed on a single chip, according to representative embodiments of FIG. 1.
Figure 2B:
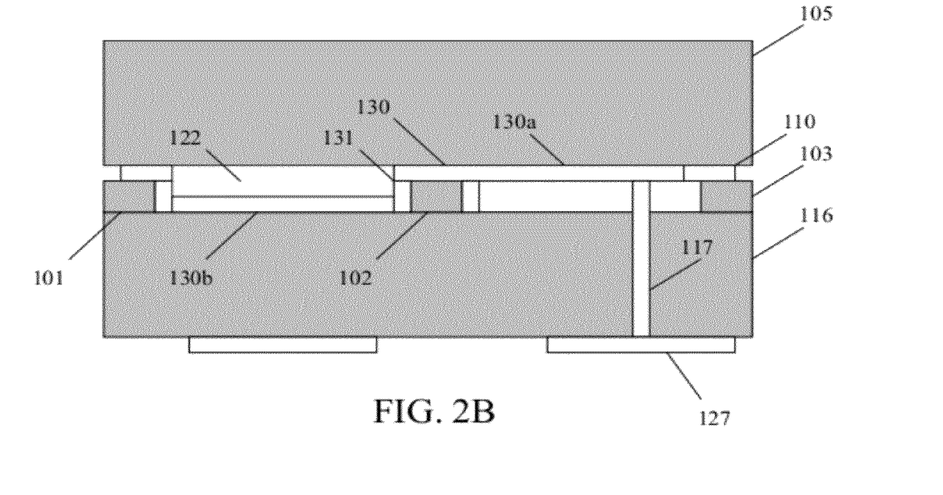
Figure 2C:
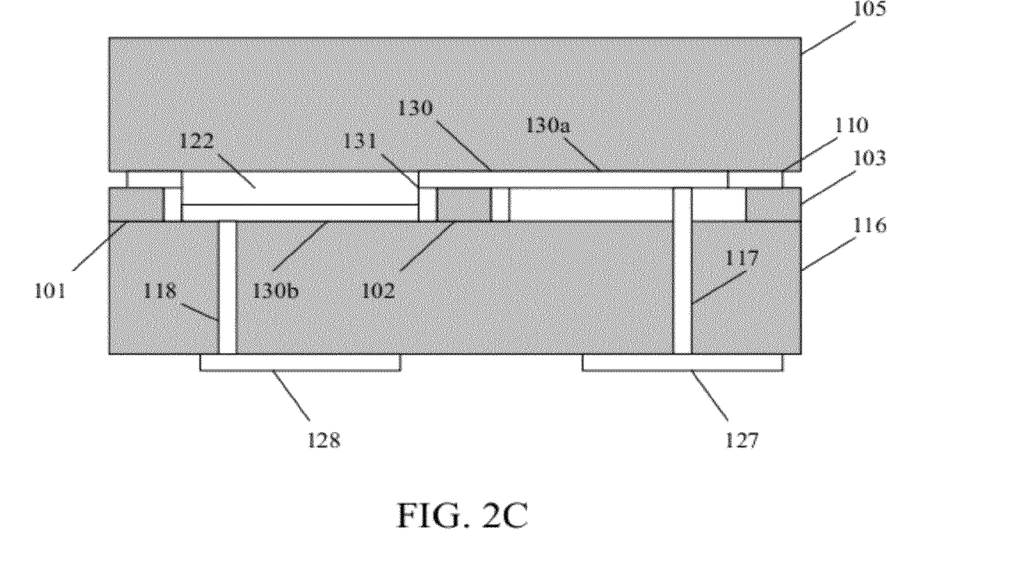

FIGS. 2A-2C are cross-sectional diagrams illustrating duplexers formed on a single chip, according to representative embodiments of FIG. 1. More particularly, FIGS. 2A-2C show illustrative cross-sectional configurations of the single-chip duplexer 100 taken along line A-A' of FIG. 1.

In each of FIGS. 2A-2C, the chip 105 is covered by cap 116, which is separated from the chip 105 by the annular sealing ring 110 to create a sealed cavity 122. In various embodiments, the cap 116 may be a microcap, as discussed for example by PHILLIBER et al., in U.S. Patent Application Pub. No. 2010/0272310, filed Apr. 28, 2009, which is hereby incorporated by reference in its entirety. For example, the cap 116 has a first (top) surface facing the first (bottom) surface of the chip 105. The first surface of the cap 116 may include corresponding surfaces of support pillars 101, 102 and 103, which extend toward the first surface of the chip 105 and directly connect to the annular sealing ring 110, although such support pillars are not necessarily included in alternative configurations. The cap 116 and the support pillars 101, 102 and 103 may be formed of the same material as the chip 105, such as Si, GaAs, InP, or the like.

Referring to FIG. 2A, the conductive stripe 130 extends entirely along the first surface of the chip 105, and both ends of the conductive stripe 130 are directly connected to the inner periphery of the annular sealing ring 110. This connection likewise establishes an electrical connection between the conductive stripe 130 and the annular sealing ring 110 at both ends of the conductive stripe 130. A conductive interconnector 117 extends through a corresponding via in the cap 116 to connect the conductive stripe 130 on the chip 105 with a ground pad 127 on a second (bottom) surface of the cap 116, where the second surface is opposite the first surface of the cap 116. Accordingly, both the conductive stripe 130 and the annular sealing ring 110 are grounded through the conductive interconnector 117. The conductive interconnector 117 may be formed of any conductive material compatible with semiconductor processors, such as W, Mo, Al, Au, or combinations thereof.

Referring to FIG. 2B, the conductive stripe 130 consists of multiple portions extending along the first surface of the chip 105 and the first surface of the cap 116, respectively. More particularly, in the depicted example, the conductive stripe 130 includes a first conductive stripe portion 130a directly connected at an outer end to the annular sealing ring 110 and extending along the first surface of the chip 105 to the support pillar 102, and a second conductive stripe portion 130b directly connected at an outer end to the annular sealing ring 110 (e.g., at the opposite side of the chip 105) and extending along the first surface of the cap 116 to the support pillar 102. The first conductive stripe portion 130a and the second conductive stripe portion 130b have respective inner ends that are connected to one another by a support conductor 131 formed (vertically) along at least one side of the support pillar 102. Accordingly, both ends of the conductive stripe 130 are directly connected to and otherwise in electrical contact with the inner periphery of the annular sealing ring 110, although one portion of the conductive stripe 130 (e.g., the first conductive stripe portion 130a) is on the chip 105 and another portion of the conductive stripe 130 (e.g., the second conductive stripe portion 130b) is on the cap 116. As discussed above, the conductive interconnector 117 extends through a corresponding via in the cap 116 to connect the conductive stripe 130 on the chip 105 with a ground pad 127 on the second surface of the cap 116. The first and second conductive stripe portions 130a and 130b and the support conductor 131 may be formed of any conductive material compatible with semiconductor processors, such as W, Mo, Al, Au, or combinations thereof.

Referring to FIG. 2C, the conductive stripe 130 again consists of multiple portions extending along the first surface of the chip 105 and the first surface of the cap 116, respectively. As discussed above, the conductive stripe 130 includes the first conductive stripe portion 130a connected at an outer end to the annular sealing ring 110 and extending along the first surface of the chip 105 to the support pillar 102, and the second conductive stripe portion 130b connected at an outer end to the annular sealing ring 110 and extending along the first surface of the cap 116 to the support pillar 102. The first conductive stripe portion 130a and the second conductive stripe portion 130b include respective inner ends that are connected to one another by the support conductor 131. Also as discussed above, the conductive interconnector 117 extends through a corresponding via in the cap 116 to connect the first conductive stripe portion 130a on the chip 105 with a ground pad 127 on the second surface of the cap 116. In addition, another conductive interconnector 118 extends through a corresponding via in the cap 116 to connect the second conductive stripe portion 130b on the cap 116 with another ground pad 128, also located on the second (bottom) surface of the cap 116. The additional connection to ground via the conductive interconnector 118 may improve magnetic shielding between the transmit and receive filters 120 and 140 by allowing screening currents to flow between these two ground connections.

Of course, in various alternative configurations, additional connections to ground through the cap 116 may be provided, including additional connections to ground of the conductive stripe 130 shown in FIG. 2A, without departing from the scope of the present teachings. Likewise, in various alternative configurations, one or more conductive interconnectors extending through corresponding vias in the cap 116 may be connected directly to annular sealing ring 110, as opposed to the conductive stripe 130, without departing from the scope of the present teachings. Also, in various alternative configurations, one or more conductive interconnectors may extend through corresponding vias in the chip 105, instead of or in addition vias extending through to the cap 116, to connect to ground pads on a second (upper) surface of the chip 105, without departing from the scope of the present teachings.

Figure 3:
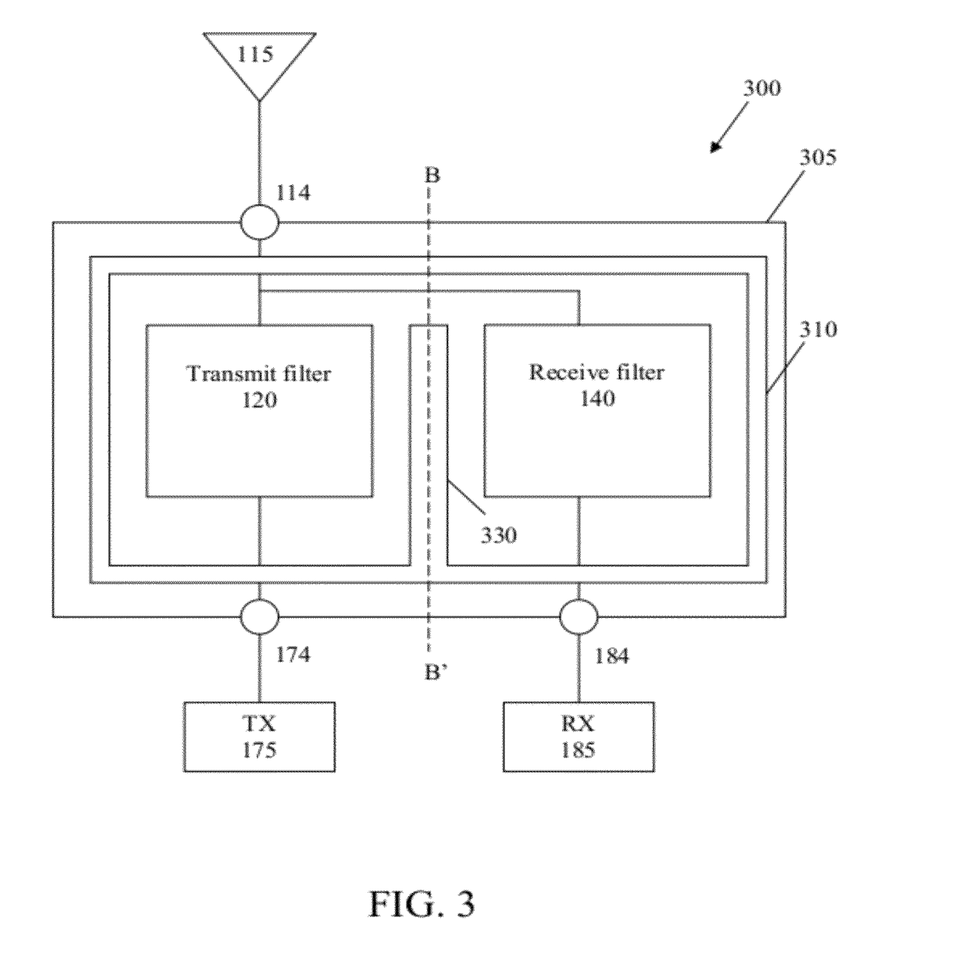
FIG. 3 is a block diagram illustrating a duplexer formed on a single chip, according to another representative embodiment.

FIG. 3 is a block diagram illustrating a duplexer formed on a single chip, according to another representative embodiment.

Referring to FIG. 3, duplexer 300 (referred to below as "single-chip duplexer 300) is formed on a single chip 305, and interfaces transmitter 175 and receiver 185 with common antenna 115. As discussed above with reference to FIG. 1, the single-chip duplexer 300 includes transmit filter 120, connected between the transmitter 175 through transmitter terminal 174 and common antenna 115 through antenna terminal 114, and receive filter 140, connected between the receiver 185 through receiver terminal 184 and the common antenna 115 through the antenna terminal 114. The antenna terminal 114, the transmitter terminal 174 and the receiver terminal 184 may correspond to connecting pads or other terminals on the chip 305, respectively. According to various embodiments, the transmit filter 120 and the receive filter 140 are FBAR or BAW resonator filters.

An annular sealing ring 310 is formed on a first surface of the chip 305, surrounding the circuitry of the transmit filter 120 and the receive filter 140, and extending generally around an outer periphery of the chip 305. The annular sealing ring 310 also connects with a first surface of a lid or cap (not shown in FIG. 3) positioned over and facing the first surface of the chip 305, as discussed below with reference to FIGS. 4A-4B, for example. The chip 305 and the annular sealing ring 310 are thus substantially the same as the chip 105 and the annular sealing ring 110 discussed above with reference to FIG. 1.

However, a conductive stripe 330 formed on the first surface of the chip 305 and positioned between the transmit filter 120 and the receive filter 140, is directly connected at only one end to the annular sealing ring 310. That is, the opposite end of the conductive stripe 330 is open, meaning that it terminates on the first surface of the chip 305 short of contacting the annular sealing ring 310. As discussed above with respect to the conductive stripe 130, the conductive stripe 330 may be formed of any conductive material compatible with semiconductor processors, such as W, Mo, Al, Au, or combinations thereof. Accordingly, the conductive stripe 330 forms a barrier or an isolation shield separating the transmit filter 120 and the receive filter 140, thus improving isolation characteristics of the transmit filter 120 and the receive filter 140. In the depicted configuration, the conductive stripe 330 serves primarily as a capacitive shield for reducing capacitive coupling between the transmit filter 120 and the receive filter 140.

Figure 4A:
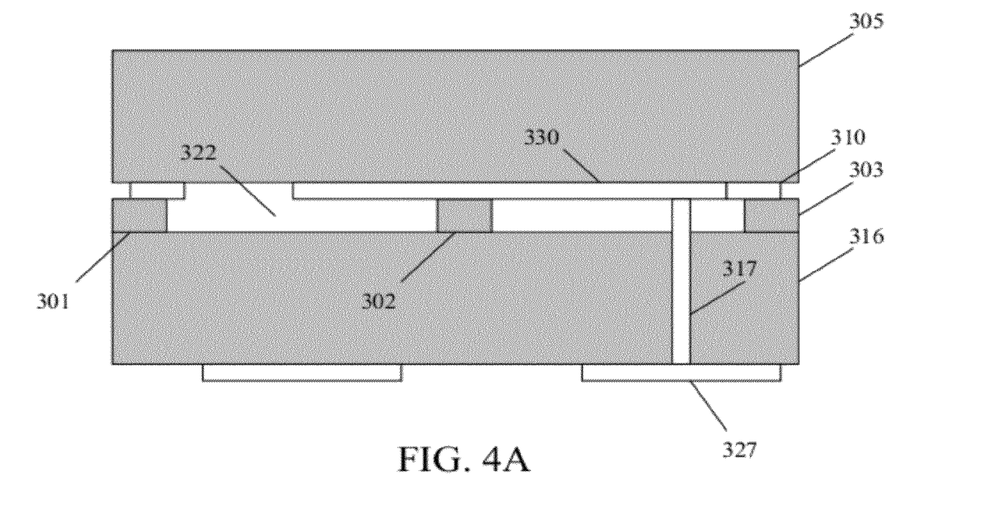
FIGS. 4A-4B are cross-sectional diagrams illustrating duplexers formed on a single chip, according to representative embodiments of FIG. 3.
Figure 4B:
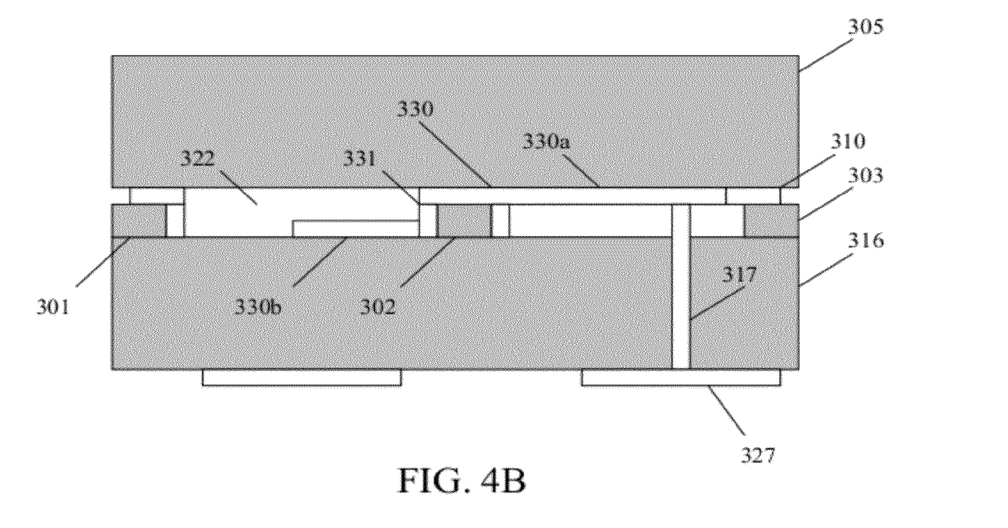

FIGS. 4A-4B are cross-sectional diagrams illustrating duplexers formed on a single chip, according to representative embodiments of FIG. 3. More particularly, FIGS. 4A-4B show illustrative cross-sectional configurations of the single-chip duplexer 300 taken along line B-B' of FIG. 3.

In each of FIGS. 4A-4B, the chip 305 is covered by cap 316, which is separated from the chip 305 by the annular sealing ring 310 to create a sealed cavity 322, as discussed above with reference to cap 116 of FIGS. 2A-2C. Thus, the cap 316 has a first (top) surface facing the first (bottom)

surface of the chip 305, which may include corresponding surfaces of support pillars 301, 302 and 303, extending toward the first surface of the chip 305 and directly contacting the annular sealing ring 310. Such support pillars are not necessarily included in alternative configurations.

Referring to FIG. 4A, the conductive stripe 330 extends along the first surface of the chip 305 between the transmit filter 120 and the receive filter 140. One end of the conductive stripe 330 is directly connected to the inner periphery of the annular sealing ring 310, which likewise establishes an electrical connection between the conductive stripe 330 and the annular sealing ring 310. However, the opposite end of the conductive stripe 330 is not connected to the annular sealing ring 310, as discussed above. A conductive interconnector 317 extends through a corresponding via in the cap 316 to connect the conductive stripe 330 on the chip 305 with a ground pad 327 on a second (bottom) surface of the cap 316, where the second surface is opposite the first surface of the cap 316. Accordingly, both the conductive stripe 330 and the annular sealing ring 310 are grounded through the conductive interconnector 317, as discussed above with reference to the conductive interconnector 117.

Referring to FIG. 4B, the conductive stripe 330 consists of multiple portions extending along the first surface of the chip 305 and the first surface of the cap 316, respectively. More particularly, in the depicted example, the conductive stripe 330 includes a first conductive stripe portion 330a connected at one end to the annular sealing ring 310 and extending along the first surface of the chip 305 to the support pillar 302. The conductive stripe 330 also includes a second conductive stripe portion 330b, which is connected at one end to the first conductive stripe portion 330a by a support conductor 331 formed (vertically) along at least one side of the support pillar 302. The second conductive stripe portion 330b extends from the support conductor 331 along the first surface of the cap 316, but ends before connecting with the annular sealing ring 310 at the opposite end. Accordingly, only one end of the conductive stripe 330 (i.e., the outer end of the first conductive stripe portion 330a) is directly connected to the inner periphery of the annular sealing ring 310. One portion of the conductive stripe 330 (e.g., the first conductive stripe portion 330a) is on the chip 305 and another portion of the conductive stripe 330 (e.g., the second conductive stripe portion 330b) is on the cap 316. As discussed above, the conductive interconnector 317 extends through a corresponding via in the cap 316 to connect the conductive stripe 330 on the chip 305 with the ground pad 327 on the second surface of the cap 316. Additional conductive interconnectors for providing ground connections may be formed through corresponding vias in the cap 316 and/or the chip 305, as discussed above.

Figure 8:
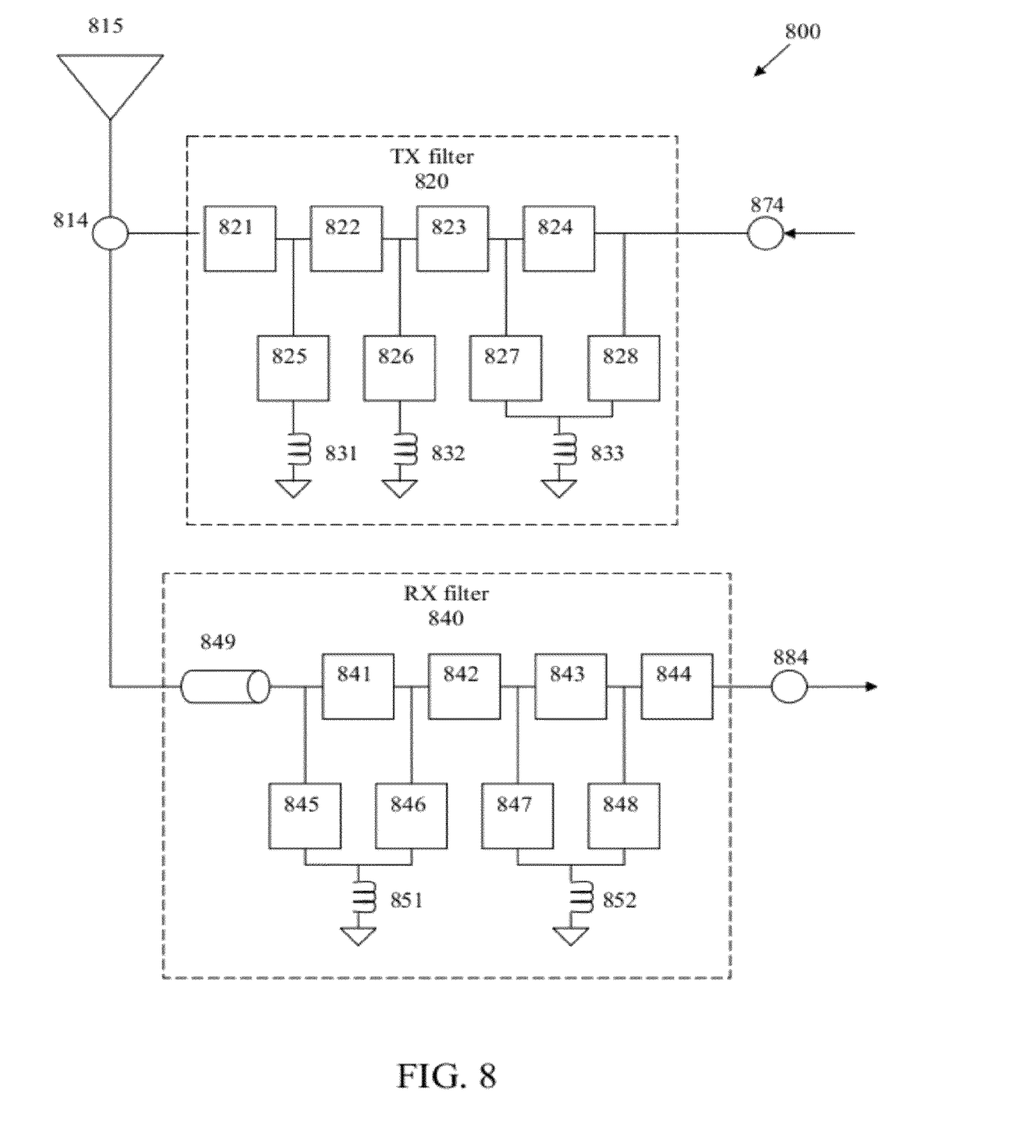
FIG. 8 is a circuit diagram illustrating an FBAR duplexer, according to a representative embodiment.

The transmit filter 120 and the receive filter 140 of the single-chip duplexer 100 may be FBAR or BAW resonator filters, including multiple FBAR or BAW resonators, respectively. FIG. 8 is a block diagram of an illustrative FBAR single-chip duplexer 800, which may be used as the single-chip duplexer 100, according to a representative embodiment. Of course the configurations of the FBARs and other components in the transmit filter 820 and the receive filter 840 of the single-chip duplexer 800, discussed below, are illustrative only, and alternative configurations of FBARs (and/or BAW resonators) may be incorporated without departing from the scope of the present teachings.

Referring to FIG. 8, the single-chip duplexer 800 includes the transmit filter 820 connected between transmitter terminal 874 and antenna terminal 814 for sending wireless communication signals via antenna 815, and the receive filter 840 connected between receiver terminal 884 and the antenna terminal 814 to receive wireless communication signals via the antenna 815. In the depicted embodiment, the transmit and receive filters 820 and 840 are ladder type filters, for example. The transmit filter 820 includes transmit resonators (e.g., FBARs or BAW resonators) 821-828 and the receive filter 840 includes receive resonators (e.g., FBARs or BAW resonators) 841-848, where each resonator has a thin film piezoelectric layer formed in a stacked structure between top and bottom electrodes. The thin film piezoelectric layer may be formed of a material such as aluminum nitride, lead zirconate titanate (PZT), or other film compatible with semiconductor processes. The top and bottom electrodes may be formed of any conductive metal compatible with semiconductor processes, such as W, Mo, Al, Au, or the like. Examples of duplexers having FBAR and BAW resonator transmit and receive filters are discussed, for example, by BRADLEY et al., in U.S. patent application Ser. No. 12/509,863, filed Jul. 27, 2009, and by FRITZ et al., in U.S. patent application Ser. No. 12/627,122, filed Nov. 30, 2009, which are hereby incorporated by reference in their entireties.

In the illustrative configuration, the transmit filter 820 has a series circuit including first through fourth series resonators 821-824 connected in series between the antenna terminal 814 and the transmitter terminal 874. The transmit filter 820 also has shunt circuits which respectively include first through fourth shunt resonators 825-828 and first through third inductors 831-833 generally connected between the shunt circuit and ground. In the depicted configuration, the first and second shunt resonators 825 and 826 are connected to ground through the first and second inductors 831 and 832, respectively, and the third and fourth shunt transmit resonators 827 and 828 are commonly connected to ground through the third inductor 833.

It may be assumed that the impedance at the antenna side of the transmit filter 820 at the RF frequency of the received signals is high enough, so there is no additional impedance matching circuit (e.g., phase shifter) needed between the transmit filter 820 and the antenna terminal 814. This is typically the case when the transmit filter 820 and the receive filter 840 are acoustic filters, and the transmit filter 820 has a lower passband frequency than the receive filter 840. However, it is understood that in various embodiments and/or configurations, the transmit filter 820 may need an impedance matching circuit, as would be apparent to one skilled in the art.

Also, in the depicted illustrative configuration, the receive filter 840 has a series circuit including first through fourth series resonators 841-844 connected in series between the antenna terminal 814 and a phase shifter 849, used for impedance transformation. The phase shifter 849 is connected to the antenna terminal 814. The receive filter 840 also has shunt circuits which respectively include first through fourth shunt resonators 845-848 and first and second inductors 851-852 generally connected between the shunt circuit and ground. In the depicted configuration, the first and second shunt resonators 845 and 846 are commonly connected to ground through the first inductor 851, and the third and fourth shunt resonators 847 and 848 are commonly connected to ground through the second inductor 852.

In an embodiment, the series and shunt resonators 821-828 of the transmit filter 820 have the same coupling coefficient, and the series and shunt resonators 841-848 of the receive filter 840 have the same coupling coefficient. Also, the coupling coefficient of the series and shunt resonators 821-828 may or may not be the same as the coupling coefficient as the series and shunt resonators 841-848 of the receive filter 840.

Use of minimum coupling coefficients with respect to series and shunt resonators 821-828 and/or 841-848 enables reduction in die size, for example.

The center frequencies of the passbands for the transmit filter 820 and the receive filter 840 are offset from one another, reducing or avoiding overlap of the respective passbands. The center frequencies are selected to be within the uplink and downlink frequency bands of the applicable communication standard, respectively. For example, in accordance with the UMTS Band 2 (PSC) standard, the available frequency band for transmit filter 820 is 1850 MHz-1910 MHz and the available frequency band for the receive filter 840 is 1930 MHz-1990 MHz. However, it is understood that the various embodiments may incorporate different standards, or may include different center frequencies and/or passbands, without departing from the scope of the present teachings.

It is understood that in alternative embodiments, the single-chip duplexer 800 may include other types and configurations of transmit and receive filters 820 and 840, and/or the series and shunt resonators 821-828 and 841-848, without departing from the scope of the present teachings. It is further understood that alternative embodiments of the single-chip duplexer 800 may combine any representative embodiment of transmit filter with any representative embodiment of the receive filter. Also, various embodiments may include a matching circuit (not shown) for the antenna terminal 814, such as a shunt inductor, in addition to or instead of the phase shifter 849. The various components of the matching circuit and/or phase shifter 849 may be implemented as external or surface mounted technology (SMT) components, for example.

Figure 5:
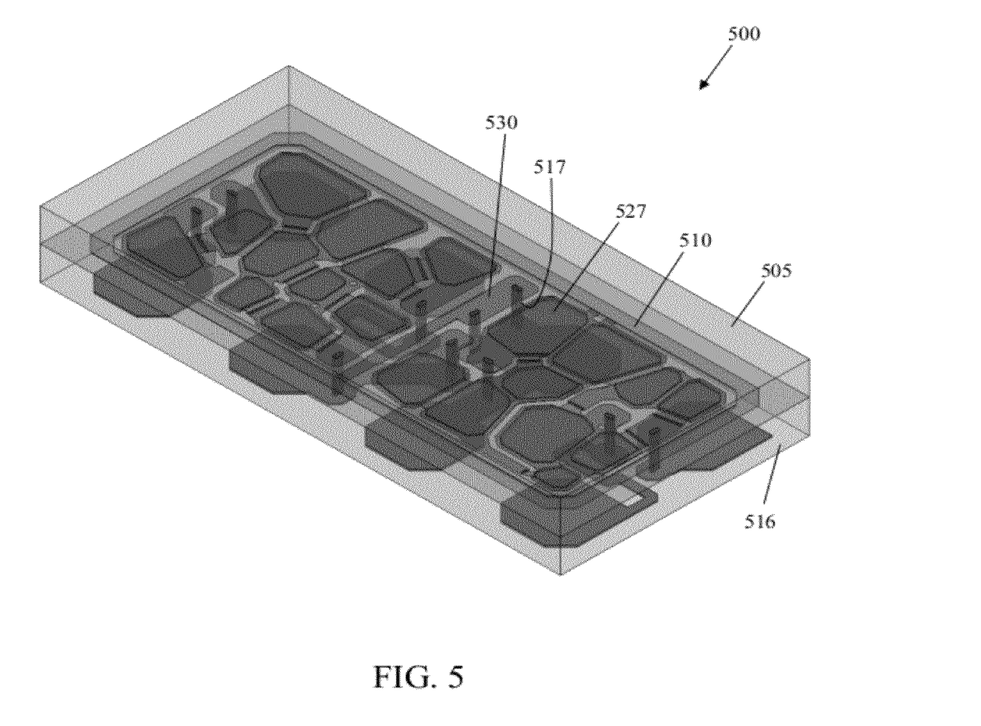
FIG. 5 is a top perspective view illustrating a duplexer formed on a single 8-pad duplexer chip, according to a representative embodiment.

FIG. 5 is a top perspective view illustrating a single-chip duplexer 500 formed on an 8-pad duplexer chip, according to a representative embodiment. For purposes of illustration, chip 505 and cap 516 of single-chip duplexer 500 are substantially transparent, in order to show various elements internal to and on bottom surfaces of the same. The single-chip duplexer 500 may be a UMTS Band 2 (PCS) duplexer, for example.

Referring to FIG. 5, the single-chip duplexer 500 includes annular sealing ring 510, which extends substantially around the periphery. As discussed above with reference to annular sealing rings 110 and 310 of FIGS. 1 and 3, the annular sealing ring 510 connects to the chip 505 and the cap 516, forming a sealed cavity. A conductive stripe 530 is formed between transmit and receive FBAR and/or BAW resonator filters (not specifically indicated in FIG. 5). In the depicted embodiment, the conductive stripe 530 is directly connected at one end to the annular sealing ring 510, while the opposing end of the conductive stripe 530 ends short of the annular sealing ring 510 on the opposite side of the single-chip duplexer 500. The conductive stripe 530 is connected to ground pad 527 via conductive interconnector 517, which extends through a corresponding via in the cap. Accordingly, the conductive stripe 530 serves primarily as a capacitive shield for reducing capacitive coupling between the transmit filter and the receive filter.

Figure 6:
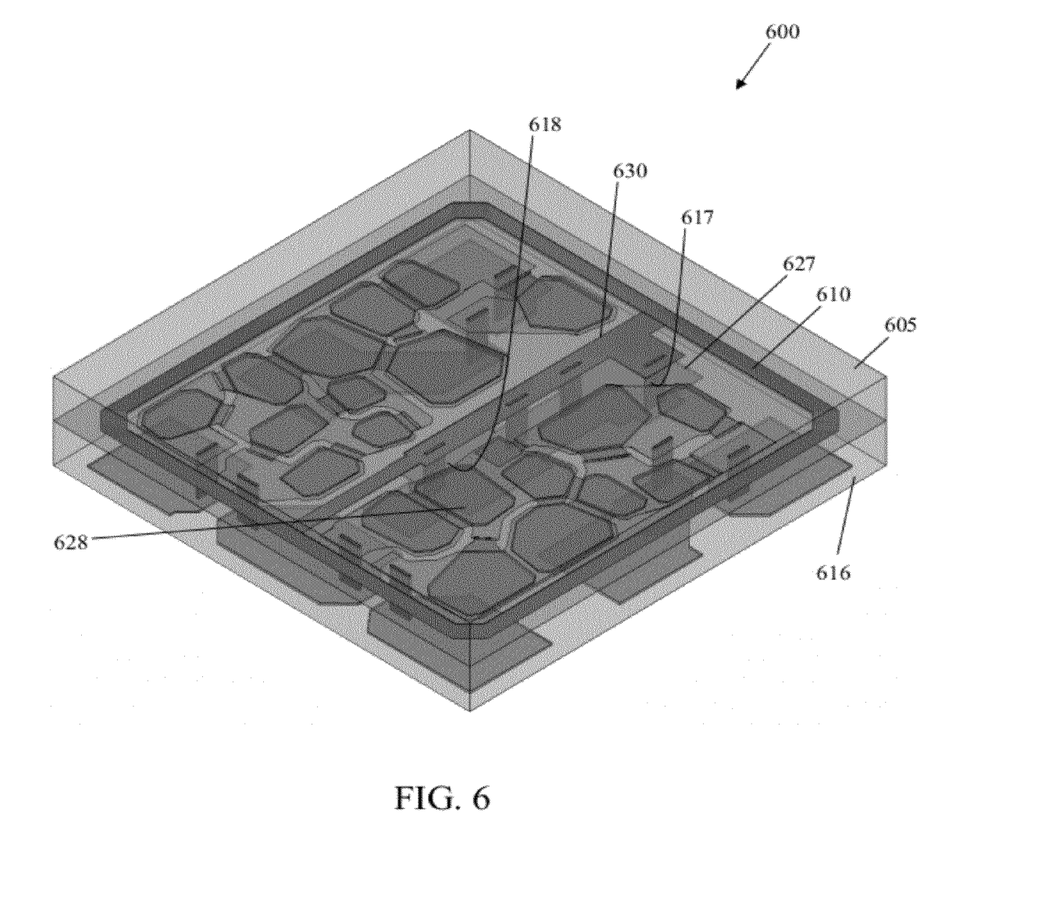
FIG. 6 is a top perspective view illustrating a duplexer formed on a single 9-pad duplexer chip, according to a representative embodiment.

FIG. 6 is a top perspective view illustrating a single-chip duplexer 600 formed on a 9-pad duplexer chip, according to another representative embodiment. For purposes of illustration, chip 605 and cap 616 of single-chip duplexer 600 are substantially transparent, in order to show various elements internal to and on bottom surfaces of the same. The single-chip duplexer 600 may also be a UMTS Band 2 (PCS) duplexer, for example.

Referring to FIG. 6, the single-chip duplexer 600 includes annular sealing ring 610, which extends substantially around the periphery. As discussed above with reference to annular sealing rings 110 and 310 of FIGS. 1 and 3, the annular sealing ring 610 connects to the chip 605 and the cap 616, forming a sealed cavity. A conductive stripe 630 is formed between transmit and receive FBAR and/or BAW resonator filters (not specifically indicated in FIG. 6). In the depicted embodiment, the conductive stripe 630 is directly connected at both ends to the annular sealing ring 610 on opposite sides of the single-chip duplexer 600. Also, the conductive stripe 630 is connected to ground pad 627 via conductive interconnector 617 and to ground pad 628 via conductive interconnector 618, where conductive interconnectors 617, 618 extend through corresponding vias in the cap. Accordingly, the conductive stripe 630 serves as both an electromagnetic shield for reducing magnetic coupling and a capacitive shield for reducing capacitive coupling between the transmit filter and the receive filter.

Figure 7:
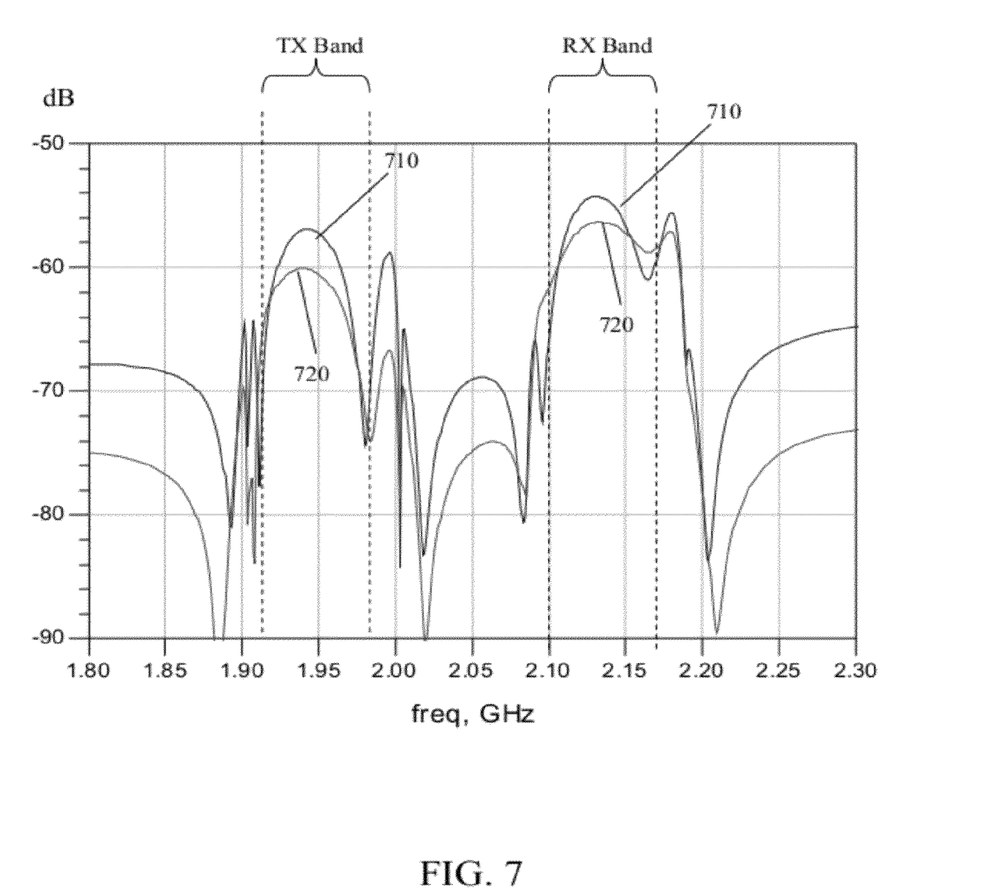
FIG. 7 is a diagram illustrating isolation characteristics of a duplexer, according to a representative embodiment.

FIG. 7 is a diagram illustrating isolation characteristics of a duplexer, according to a representative embodiment. The isolation characteristics correspond to an illustrative UMTS Band 1 (IMT) single-chip duplexer, which may have a cross-sectional configuration as shown in FIG. 2B, for example. The isolation characteristics indicate the extent of isolation between transmit and receive FBAR and/or BAW resonator filters, with respect to magnetic and capacitive coupling.

Referring to FIG. 7, a transmitter (e.g., transmitter 175) and a receiver (e.g., receiver 185) are operating in UMTS Band 1, for example, with a transmit center frequency of about 1950 MHz in the transmit (uplink) frequency band of 1920 MHz-1980 MHz, and a receive center frequency of about 2140 MHz in the receive (downlink) frequency band of 2110 MHz-2170 MHz. The single-chip duplexer is operating as a three-port network, for example, where the antenna terminal is port 1, the transmitter terminal is port 2 and the receiver terminal is port 3.

Trace 710 shows the isolation characteristics of the single-chip duplexer with no isolation shield, and trace 720 shows the isolation characteristics of the single-chip duplexer with an isolation shield, according to a representative embodiment. More particularly, traces 710 and 720 plot isolation as a function of transmission coefficient $S_{23}$ (in dB) with respect to the receiver and transmitter terminals (or ports) in the transmit and receive frequency bands of UMTS Band 1 (IMT). As shown in FIG. 7, trace 710 is about 3-4 dB higher than trace 720 in each of the transmit and receive frequency bands (bands of interest), and about 8 dB higher than trace 720 outside the transmit and receive frequency bands. The difference between traces 710 and 720 indicates that the magnitude of unwanted signal getting through the transmitter and receiver terminals at the respective bands of interest is about twice as high in trace 710 than in trace 720. Thus, trace 720 shows substantial improvement in the isolation characteristics of the single-chip duplexer, according to the representative embodiment.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A duplexer interfacing a receiver and a transmitter with a common antenna, the duplexer comprising:

a transmit filter on a chip connected between the antenna and the transmitter, the transmit filter having a transmit passband;

a receive filter on the chip connected between the antenna and the receiver, the receive filter having a receive passband different from the transmit passband;

an annular sealing ring connected between a first surface of the chip and a first surface of a cap to form a sealed cavity between the chip and the cap;

a support pillar extending between the first surface of the chip and the first surface of the cap to separate the chip and the cap, a support conductor being formed along the support pillar; and a conductive stripe extending across a portion of the first surface of the chip and a portion of the first surface of the cap between the transmit filter and the receive filter, the conductive stripe being electrically connected to ground, and providing at least one of magnetic shielding and capacitive shielding between the transmit filter and the receive filter, wherein the conductive stripe comprises:

a first conductive stripe portion extending across the portion of the first surface of the chip from the annular sealing ring to the support pillar, the first conductive stripe portion being directly connected at one end to the annular sealing ring and at an opposite end to the support conductor; and a second conductive stripe portion extending across the portion of the first surface of the cap from the support pillar, the second conductive strip portion being connected at one end to the opposite end of the first conductive stripe portion via the support conductor.

2. The duplexer of claim 1, wherein the transmit filter comprises a plurality of first film bulk acoustic resonators (FBARs), and the receive filter comprises a plurality of second FBARs.

3. The duplexer of claim 1, wherein the transmit filter comprises a plurality of first bulk acoustic wave (BAW) resonators, and the receive filter comprises a plurality of second BAW resonators.

4. The duplexer of claim 1, further comprising:
a first conductive interconnector extending through a corresponding via in the cap and connecting the conductive stripe on the first surface of the chip with a first ground pad on a second surface of the cap, opposite the first surface of the cap.

5. The duplexer of claim 4, further comprising:
a second conductive interconnector extending through a corresponding via in the cap and connecting the conductive stripe on the first surface of the cap with a second ground pad on the second surface of the cap.

6. The duplexer of claim 1, wherein the second conductive stripe portion is directly connected at an opposite end to the annular sealing ring.

7. The duplexer of claim 1, wherein the second conductive stripe portion is not directly connected at an opposite end to the annular sealing ring.

8. The duplexer of claim 1, wherein the sealing ring is formed substantially along an outer periphery of the chip.

9. The duplexer of claim 8, wherein each of the chip and the cap comprises gallium arsenide (GaAs).

10. The duplexer of claim 8, wherein each of the chip and the cap comprises indium phosphide (InP).

11. The duplexer of claim 8, wherein each of the chip and the cap comprises silicon (Si).

12. The duplexer of claim 8, wherein the annular sealing ring comprises gold, and the conductive stripe comprises at least one of molybdenum and tungsten.

13. A duplexer on a single semiconductor chip interfacing a receiver and a transmitter with a common antenna, the duplexer comprising:

a transmit filter on the semiconductor chip connected between an antenna terminal and a transmitter terminal, the transmit filter comprising a plurality of transmit film bulk acoustic resonators (FBARs);

a receive filter on the semiconductor chip connected between the antenna terminal and a receiver terminal, the receive filter comprising a plurality of receive FBARs;

an annular sealing ring around a periphery of the semiconductor chip for creating a sealed cavity between the semiconductor chip and a corresponding semiconductor cap attached to a surface of the semiconductor chip via the annular sealing ring; and an isolation shield directly connected to the annular sealing ring and positioned between the transmit filter and the receive filter, the isolation shield reducing at least one of magnetic coupling and capacitive coupling between the transmit filter and the receive filter.

14. The duplexer of claim 13, wherein the isolation shield comprises a conductive stripe extending across the surface of the semiconductor chip between the transmit filter and the receive filter, the conductive stripe being directly connected at a first end and a second end to the annular sealing ring.

15. The duplexer of claim 13, wherein the isolation shield comprises a conductive stripe extending across a portion of the surface of the semiconductor chip between the transmit filter and the receive filter, the conductive stripe being directly connected only at a first end to the annular sealing ring.

16. The duplexer of claim 13, wherein the isolation shield comprises:

a first conductive stripe portion extending across a portion of the surface of the semiconductor chip, the first conductive stripe portion being directly connected only at a first end to the annular sealing ring; and a second conductive stripe portion extending across a portion of a surface of the semiconductor cap facing the surface of the semiconductor chip, the second conductive stripe portion being directly connected to the annular sealing ring at a first end and connected via a support conductor to the first conductive strip portion at a second end.

17. The duplexer of claim 13, wherein the transmit filter comprises first series FBARs connected in series between the antenna terminal and the transmitter terminal, and first shunt FBARs respectively connected between at least one of the first series FBARS and ground; and wherein the receive filter comprises second series FBARs connected in series between the antenna terminal and the receiver terminal, and second shunt FBARs respectively connected between at least one of the second series FBARS and ground.

18. A duplexer device comprising:
a semiconductor chip;
a semiconductor cap connected to the semiconductor chip via a conductive annular sealing ring, the annular sealing ring forming a sealed cavity between the semiconductor chip and the semiconductor cap;
a transmit filter on the semiconductor chip connected between an antenna terminal corresponding to a common antenna and a transmitter terminal corresponding to a transmitter, the transmit filter comprising a first plurality of acoustic resonators;
a receive filter on the semiconductor chip connected between the antenna terminal and a receiver terminal corresponding to a receiver, the receive filter comprising a second plurality of acoustic resonators;
a conductive stripe positioned between the transmit filter and the receive filter, the conductive stripe being directly connected to the annular sealing ring and electrically connected to at least one ground pad by a conductive interconnector through a via in the semiconductor cap, the conductive stripe increasing isolation between the transmit filter and the receive filter,
wherein each of the first and second plurality of acoustic resonators comprises one of a film bulk acoustic resonator (FBAR) or a bulk acoustic wave (BAW) resonator.

19. The duplexer device of claim 18, wherein the conductive stripe comprises a first end directly connected to the annular sealing ring on one side of the duplexer device and a second end directly connected to the annular sealing ring on an opposite side of the duplexer device.

* * * * *